US005818260A

United States Patent [19]
Kuo

[11] Patent Number: 5,818,260
[45] Date of Patent: Oct. 6, 1998

[54] TRANSMISSION LINE DRIVER HAVING CONTROLLABLE RISE AND FALL TIMES WITH VARIABLE OUTPUT LOW AND MINIMAL ON/OFF DELAY

[75] Inventor: James R. Kuo, Cupertino, Calif.

[73] Assignee: National Semiconductor Corporation, Santa Clara, Calif.

[21] Appl. No.: 639,921

[22] Filed: Apr. 24, 1996

[51] Int. Cl.[6] .................... H03K 19/0185; H03K 19/017
[52] U.S. Cl. ................................ 326/86; 326/17; 326/21; 326/83; 327/180
[58] Field of Search ........................... 326/21, 30, 82–83, 326/86, 17; 327/58, 180

[56] References Cited

U.S. PATENT DOCUMENTS

| | | | |
|---|---|---|---|
| 3,333,113 | 7/1967 | Cole et al. | 307/88.5 |
| 3,899,754 | 8/1975 | Brolin | 332/11 |
| 4,254,501 | 3/1981 | Griffith et al. | 375/9 |
| 4,385,394 | 5/1983 | Pace | 375/36 |
| 4,393,494 | 7/1983 | Belforte et al. | 370/27 |
| 4,419,594 | 12/1983 | Gemmell et al. | 307/297 |

(List continued on next page.)

FOREIGN PATENT DOCUMENTS

| | | | |
|---|---|---|---|
| 0 199 374 | 10/1986 | European Pat. Off. | H03K 19/094 |
| 0 351 820 A2 | 7/1989 | European Pat. Off. | H03K 19/017 |
| 0 504 983 A1 | 3/1992 | European Pat. Off. | G05F 3/24 |
| 0 557 080 A1 | 8/1993 | European Pat. Off. | H03K 19/003 |
| 0575 676 A1 | 12/1993 | European Pat. Off. | H03K 19/00 |
| WO 85/02507 | 6/1985 | WIPO | H03K 19/092 |
| WO 85/04774 | 10/1985 | WIPO | H03K 19/086 |
| WO 86/01055 | 2/1986 | WIPO | H03K 19/092 |
| WO 89/00362 | 1/1989 | WIPO | H03K 10/094 |
| WO 91/20129 | 12/1991 | WIPO | H03K 19/003 |

OTHER PUBLICATIONS

Authored by Phillip E. Allen & Douglas R. Holberg, Entitled "CMOS Analog Circuit Design", 1987, pp. 240–251, published by Holt, Rinehart and Winston, Inc.

Bill Gunning, "GTL Fact Sheet", Sep. 20, 1991, all pages.
Paul R. Gray & Robert G. Meyer, "Analysis and Design of Analog Integrated Circuits", 1977, pp. 254–261.
"Electronically Switchable Interface Circuit With Multiple EIA Protocol Drivers and Receivers", IBM Technical Disclosure Bulletin, vol. 30, No. 11, Apr. 1988, all pages.
Boris Bertolucci, "Fastbus Dual–Port Memory and Display Diagnostic Module" IEEE Transactions on Nuclear Science, vol. NS–34, No. 1, Feb. 1987, pp. 253–257.
National Semiconductor Corporation, "DS36950 Quad differential bus Transceiver", Interface Databook, 1990 Edition, pp. 1–123 to 1–131.
National Semiconductor Corporation, "DS3886 BTL 9–Bit Latching Data Transceiver", high Performance Bus Interface Designer's Guide, 1991 Edition, pp. 1–74 to 1–80.
National Semiconductor Corporation, "DS3883 BTL 9–bit Data Transceiver", High Performance Bus Interface Designer's Guide, 1991 Edition, pp. 1–58 to 1–62.

*Primary Examiner*—Jon Santamauro
*Attorney, Agent, or Firm*—Limbach & Limbach, LLP

[57] ABSTRACT

A driver for providing binary signals from a data system to a transmission line includes a data input node and an output transistor coupled between a data output node and ground. The output transistor has a gate, a source and a corresponding gate-source voltage therebetween. A first transistor is coupled to the gate of the output transistor and is responsive to signals applied to the input node. It conducts a discharge current from the gate of the output transistor for discharging the gate of the output transistor to reduce its gate-source voltage. A clamping circuit clamps the gate-source voltage of the output transistor to a first voltage level above ground to prevent the discharge current from reducing the, gate-source voltage of the output transistor to ground. In another embodiment, a supply voltage dependent current source adjusts a gate voltage of a second transistor in response to an increase in the supply voltage so that an initial charging current is maintained at a relatively constant level in response to increases in the supply voltage. A method of reducing a turn-on delay of an output transistor of a transmission line driver is also disclosed.

24 Claims, 7 Drawing Sheets

U.S. PATENT DOCUMENTS

| | | | |
|---|---|---|---|
| 4,545,948 | 10/1985 | Morris et al. | 307/296 |
| 4,588,941 | 5/1986 | Kerth et al. | 323/314 |
| 4,647,912 | 3/1987 | Bates et al. | 340/825.5 |
| 4,723,108 | 2/1988 | Murphy et al. | 323/315 |
| 4,751,404 | 6/1988 | Yuen | 307/297 |
| 4,760,292 | 7/1988 | Bach | 307/475 |
| 4,763,021 | 8/1988 | Stickel | 307/475 |
| 4,774,422 | 9/1988 | Donaldson et al. | 307/475 |
| 4,825,402 | 4/1989 | Jalali | 364/900 |
| 4,855,622 | 8/1989 | Johnson | 307/456 |
| 4,855,623 | 8/1989 | Flaherty | 307/475 |
| 4,894,561 | 1/1990 | Nogami | 307/443 |
| 4,922,140 | 5/1990 | Gahle et al. | 307/591 |
| 4,929,941 | 5/1990 | Lecocq | 340/825 |
| 4,972,106 | 11/1990 | Ruijs | 307/473 |
| 4,978,905 | 12/1990 | Hoff et al. | 323/314 |
| 4,980,579 | 12/1990 | McDonald et al. | 307/455 |
| 5,015,888 | 5/1991 | Ovens | 307/475 |
| 5,017,813 | 5/1991 | Galbraith et al. | 307/475 |
| 5,019,728 | 5/1991 | Sanwo et al. | 307/475 |
| 5,021,684 | 6/1991 | Ahuja et al. | 307/443 |
| 5,021,691 | 6/1991 | Saito | 307/475 |
| 5,023,487 | 6/1991 | Wellheuser et al. | 307/475 |
| 5,023,488 | 6/1991 | Gunning | 307/475 |
| 5,034,632 | 7/1991 | Jansson et al. | 307/456 |
| 5,041,743 | 8/1991 | Matsumoto | 307/455 |
| 5,070,256 | 12/1991 | Grondalski | 307/270 |
| 5,079,456 | 1/1992 | Kotowski et al. | 307/571 |
| 5,081,380 | 1/1992 | Chen | 307/591 |
| 5,083,051 | 1/1992 | Whatley et al. | 326/30 X |
| 5,095,231 | 3/1992 | Sartori et al. | 307/475 |
| 5,117,130 | 5/1992 | Shoji | 307/443 |
| 5,118,971 | 6/1992 | Schenck | 307/443 |
| 5,165,046 | 11/1992 | Hesson | 307/270 |
| 5,184,033 | 2/1993 | Chiao et al. | 326/21 |
| 5,198,701 | 3/1993 | Davies et al. | 307/296 |
| 5,200,654 | 4/1993 | Archer | 307/491 |
| 5,208,492 | 5/1993 | Masumoto et al. | 307/469 |
| 5,216,292 | 6/1993 | Imazu et al. | 307/443 |
| 5,218,239 | 6/1993 | Boomer | 307/443 |
| 5,231,315 | 7/1993 | Thelen, Jr. | 307/491 |
| 5,241,221 | 8/1993 | Fletcher et al. | 307/263 |
| 5,254,883 | 10/1993 | Horowitz et al. | 307/443 |
| 5,285,116 | 2/1994 | Thaik | 307/443 |
| 5,287,386 | 2/1994 | Wade et al. | 375/36 |
| 5,291,071 | 3/1994 | Allen et al. | 307/270 |
| 5,293,082 | 3/1994 | Bathaee | 307/270 |
| 5,296,756 | 3/1994 | Patel et al. | 307/443 |
| 5,304,861 | 4/1994 | Fruhauf et al. | 307/296 |
| 5,313,118 | 5/1994 | Lundberg | 307/451 |
| 5,315,174 | 5/1994 | Chang et al. | 307/443 |
| 5,319,258 | 6/1994 | Ruetz | 307/443 |
| 5,329,184 | 7/1994 | Redfern | 307/47 |
| 5,334,882 | 8/1994 | Ting | 307/270 |
| 5,338,987 | 8/1994 | Tomasetti et al. | 307/570 |
| 5,438,282 | 8/1995 | Kuo | 326/86 |
| 5,463,221 | 10/1995 | Kuo | 326/86 |
| 5,483,184 | 1/1996 | Kuo | 327/83 |
| 5,504,782 | 4/1996 | Campbell, Jr. | 327/103 X |
| 5,539,341 | 7/1996 | Kuo | 327/108 |
| 5,543,746 | 8/1996 | Kuo | 327/543 |
| 5,557,223 | 9/1996 | Kuo | 327/108 |

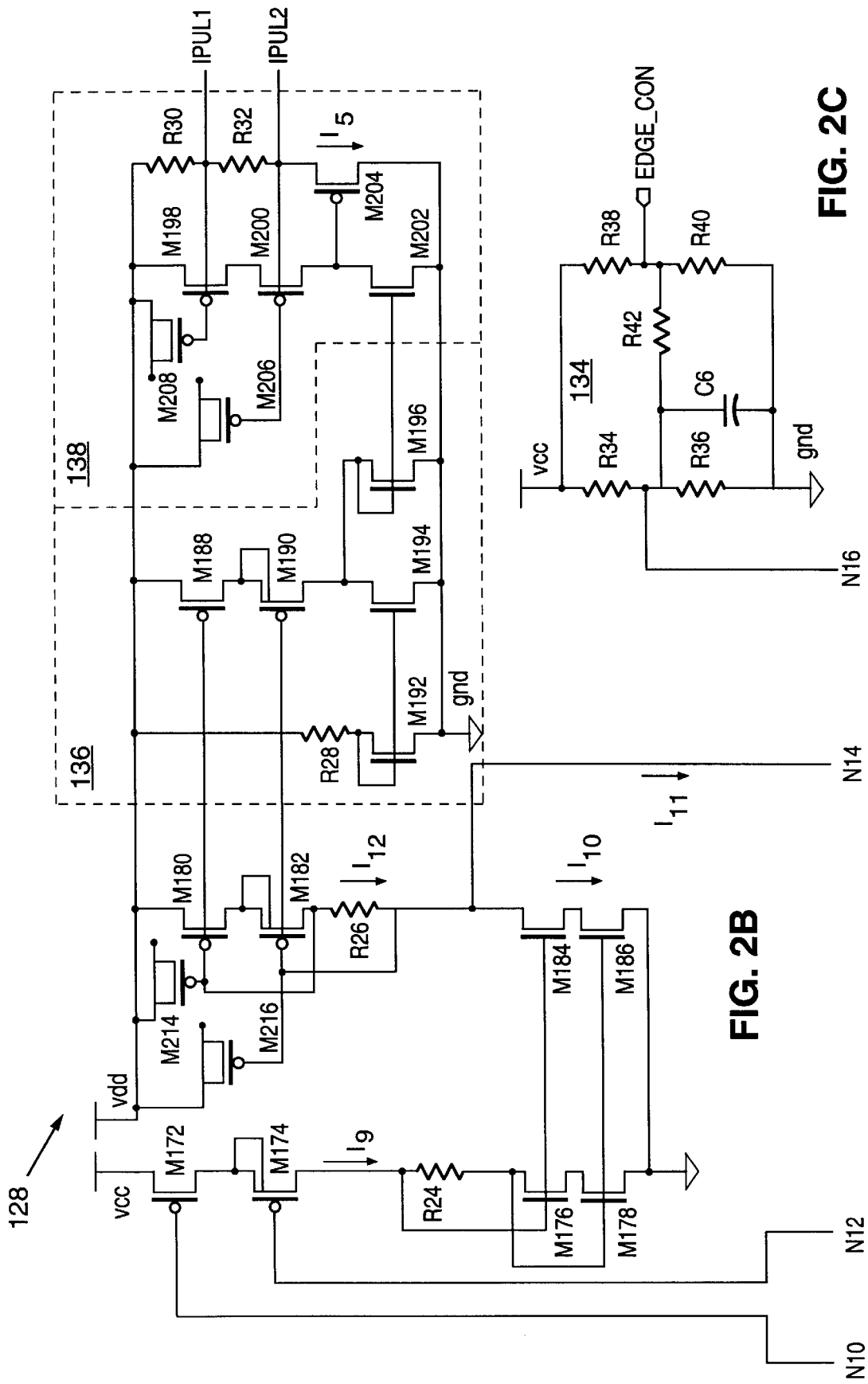

and MINIMAL ON/OFF DELAY

TRANSMISSION LINE DRIVER HAVING CONTROLLABLE RISE AND FALL TIMES WITH VARIABLE OUTPUT LOW AND MINIMAL ON/OFF DELAY

BACKGROUND OF THE INVENTION

1. Field of the Invention

The present invention relates to line interface devices, and, in particular, to a driver having a programmable output voltage swing and programmable edge rate control that may be used for interfacing CMOS digital circuits to transmission lines.

2. Description of the Related Art

Data transceivers (TRANSmitter/reCEIVER) are used to interface Very Large Scale Integrated (VLSI) circuits to transmission mediums. The transmission mediums are typically traces which are formed on printed circuit board (PCB) substrates of daughter and mother boards. Microstrip traces and strip line traces can be employed to form transmission lines having characteristic impedances on the order of about 50Ω–70Ω. Such transmission lines usually have their opposite ends terminated in their characteristic impedance. Because of these parallel resistive terminations, the effective resistance of the transmission line may be as low as 25Ω–35Ω.

A data transceiver is a read/write terminal capable of transmitting information to and receiving information from the transmission medium. A transceiver typically includes a line driver stage (or simply "driver") and a receiver stage (or simply "receiver"). The common purpose of transmission line drivers and receivers is to transmit data quickly and reliably through a variety of environments over electrically long distances. This task is complicated by the fact that externally introduced noise and ground shifts can severely degrade the data.

Drivers amplify digital signal outputs from the VLSI circuitry so that the signals can be properly transmitted on the transmission medium. Receivers are typically differential amplifiers that receive signals from the transmission medium and provide outputs to the VLSI circuitry that are representative of digital information received from the medium.

Conventional drivers usually include level shifting capability to provide compatibility with different integrated circuit technologies. Specifically, before a driver transmits a signal across a transmission medium, the driver changes the nominal voltage swing (or the "dynamic signal range") utilized by the VLSI circuitry, e.g., CMOS, TL, ECL, etc., to a different voltage swing that is utilized by the transmission medium. Thus, a driver not only amplifies a digital signal, but it changes the nominal voltage swing of the signal as well.

A different nominal voltage swing is normally used when transmitting data across a transmission medium in order to conserve power. Specifically, the power internally dissipated by the driver is proportional to the nominal voltage swing of the binary signal it applies to the transmission line. Therefore, power dissipation is reduced if the driver transmits a signal having a relatively small voltage swing over the transmission line.

It has become common for signals to be transmitted over transmission lines at BTL (Backplane Transceiver Logic) signal levels. The signal level standard is denoted "Backplane" because BTL has been used primarily in the backplane buses of mother boards. Because the nominal voltage swing of BTL is 1.0 Volt (logic low) to 2.1 Volts (logic high), power dissipation is less than it would be if the signals were transmitted over the transmission lines at CMOS (0 Volts to 3.3 Volts, or, 0 Volts to 5.0 Volts) or TTL (0 volts to 3.5 Volts) signal levels.

Bipolar technology is attractive for implementing I/O devices, such as line or bus drivers, because of its unique high current gain characteristic. High current gain is important in a bus system because the drivers must be capable of driving transmission lines in both unloaded and loaded conditions.

Although bipolar technology is capable of generating the current required to drive a backplane bus, it suffers from a number of disadvantages. First, bipolar transistors have a large collector capacitance which causes a large driver output capacitance. Second, bipolar drivers have very fast rising and falling edges. Without control, the fast rising and falling edge can create ground bouncing, output over/under shoot, and cross-talk between bus conductors. These adverse effects can significantly reduce a receiver's noise margin. Another disadvantage of bipolar drivers is the skew between their turn-on and turn-off delay. Other disadvantages of bipolar drivers are high power dissipation and the inefficiency of large scale integration due to lower gate density and higher cost.

Signals have also been transmitted over transmission lines at the so-called "GTL" signal levels disclosed in U.S. Pat. No. 5,023,488 to Gunning ("Gunning"). Gunning discloses such GTL drivers and receivers for interfacing VLSI CMOS circuits to transmission lines. The nominal voltage swing of GTL is approximately 0.3 Volts (logic low) to 1.2 Volts (logic high).

The GTL driver disclosed in Gunning suffers from a number of disadvantages which cause output pulse distortion. First, the feedback circuit that is used to control the rising edge of the output prevents the drain voltage of the output transistor from increasing to a level significantly above its gate voltage. Because the drain voltage is held low, the output cannot go high until the feedback circuit is disabled which increases the propagation delay of the driver.

A second disadvantage of the GTL driver is that its rise time $t_r$, fall time $t_f$, edge rate, turn-on delay, turn-off delay, and propagation delay are sensitive to temperature variations, supply voltage variations, and process variations.

A third disadvantage of the GTL driver is that its minimum rise time $t_r$ and fall time $t_f$ are too fast which causes ground bouncing, output over-shooting, and large cross-talk.

Thus, there is a need for a transmission line driver that overcomes the disadvantages of conventional bipolar BTL drivers, and there is a need for a transmission line driver that provides an output voltage swing of approximately 0.3 Volts (logic low) to 1.2 Volts (logic high) and that overcomes the disadvantages of the GTL driver discussed above.

SUMMARY OF THE INVENTION

The present invention provides a driver for providing binary signals from a data system to a transmission line. The driver includes a data input node and an output transistor coupled between a data output node and ground. The output transistor has a gate, a source and a corresponding gate-source voltage therebetween. A first transistor is coupled to the gate of the output transistor and is responsive to signals applied to the input node. The first transistor conducts a discharge current from the gate of the output transistor for discharging the gate of the output transistor to reduce its gate-source voltage. A clamping circuit clamps the gate-source voltage of the output transistor to a first voltage level above ground to prevent the discharge current from reducing the gate-source voltage of the output transistor to ground.

The present invention also provides a driver for providing binary signals from a data system to a transmission line. The driver includes a data input node and an output transistor coupled between a data output node and ground. The output transistor has a gate, a source and a corresponding gate-source voltage therebetween. A first transistor is coupled to the gate of the output transistor and is responsive to signals applied to the input node. The first transistor conducts an initial charging current from a supply voltage node to the gate of the output transistor for charging the gate of the output transistor to increase its gate-source voltage. A second transistor is coupled in series with the first transistor. A supply voltage dependent current source is coupled to the second transistor for adjusting a gate voltage of the second transistor in response to an increase in the supply voltage so that the initial charging current is maintained at a relatively constant level in response to increases in the supply voltage.

The present invention also provides a driver for providing binary signals from a data system to a transmission line. The driver includes a data input node and an output transistor coupled between a data output node and ground. The output transistor has a gate, a source and a corresponding gate-source voltage therebetween. A first transistor is coupled to the gate of the output transistor and responsive to signals applied to the input node. The first transistor conducts a charge holding current to the gate of the output transistor for maintaining a charge on the gate of the output transistor to maintain its gate-source voltage at a relatively constant level. Second and third transistors are coupled in series with the first transistor to conduct the charge holding current. A positive temperature coefficient current source is coupled to the second and third transistors for adjusting gate voltages of the second and third transistors in order to compensate the charge holding current for variations in temperature.

The present invention also provides a driver for providing binary signals from a data system to a, transmission line. The driver includes a data input node and an output transistor coupled between a data output node and ground. The output transistor has a gate, a source and a corresponding gate-source voltage therebetween. A voltage sensing amplifier is coupled to the gate of the output transistor for conducting a charging current to the gate of the output transistor to increase its gate-source voltage. A first transistor, responsive to signals applied to the input node, conducts a first current to the voltage sensing amplifier. Second and third transistors are coupled in series with the first transistor and coupled to the voltage sensing amplifier to conduct the first current. A positive temperature coefficient current source is coupled to the second and third transistors for adjusting gate voltages of the second and third transistors in order to compensate the first current for variations in temperature.

The present invention also provides a method of reducing a turn-on delay of an output transistor of a transmission line driver. The method includes the steps of: discharging a gate of the output transistor with a discharge current in order to reduce a gate-source voltage of the output transistor; clamping the gate-source voltage of the output transistor to a first voltage level above ground and below a threshold voltage of the output transistor in order to prevent the gate-source voltage of the output transistor from being reduced to ground; and charging the gate of the output transistor in order to increase its gate-source voltage from the first voltage level to a voltage level above the threshold voltage.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

FIGS. 2A, 2B and 2C are schematic diagrams illustrating a current source that may be used in the transmission line driver shown in FIGS. 1A and 1B.

DETAILED DESCRIPTION OF THE INVENTION

Figure 1A:
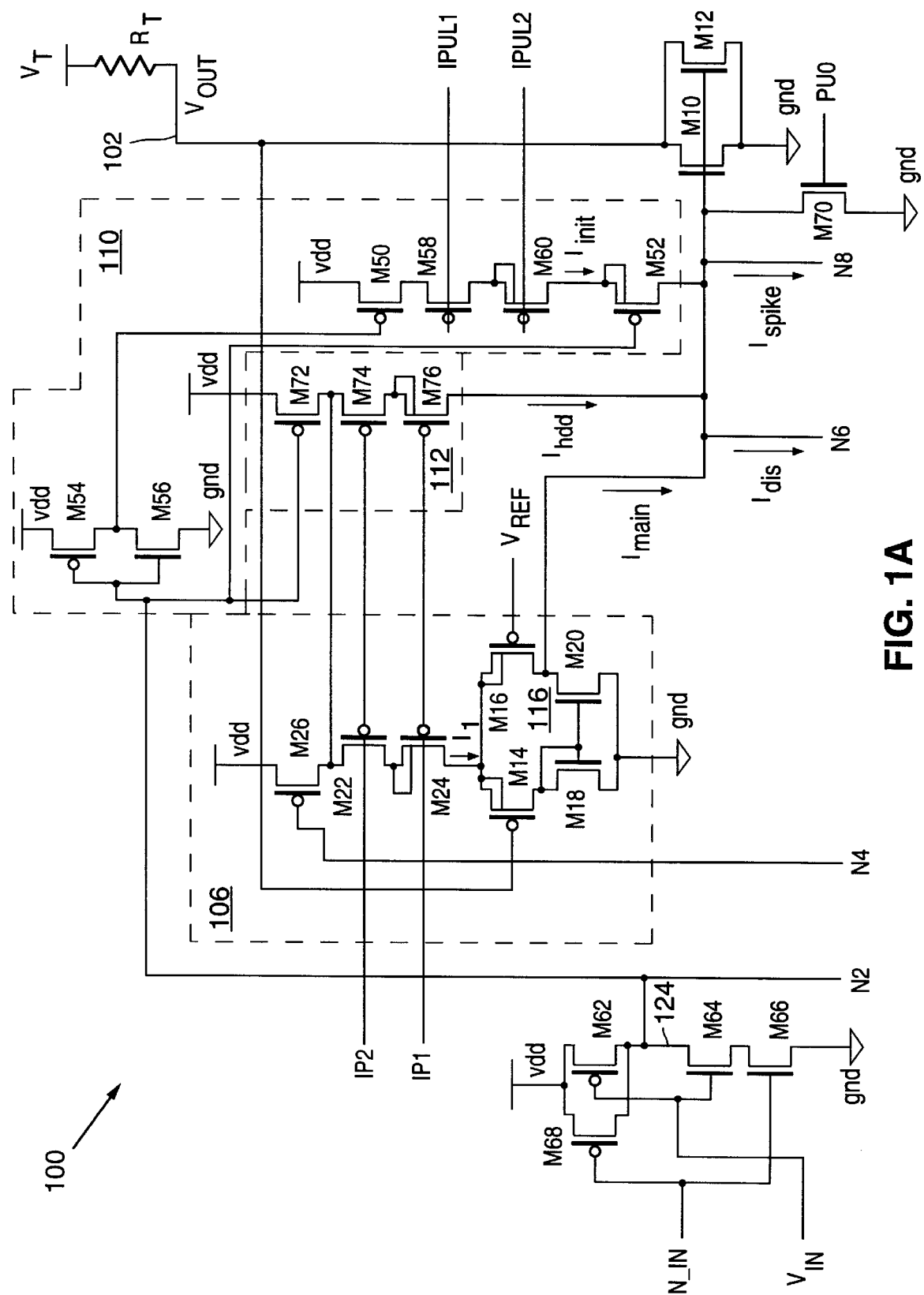
FIGS. 1A and 1B are schematic diagrams illustrating a transmission line driver in accordance with the present invention.
Figure 1B:
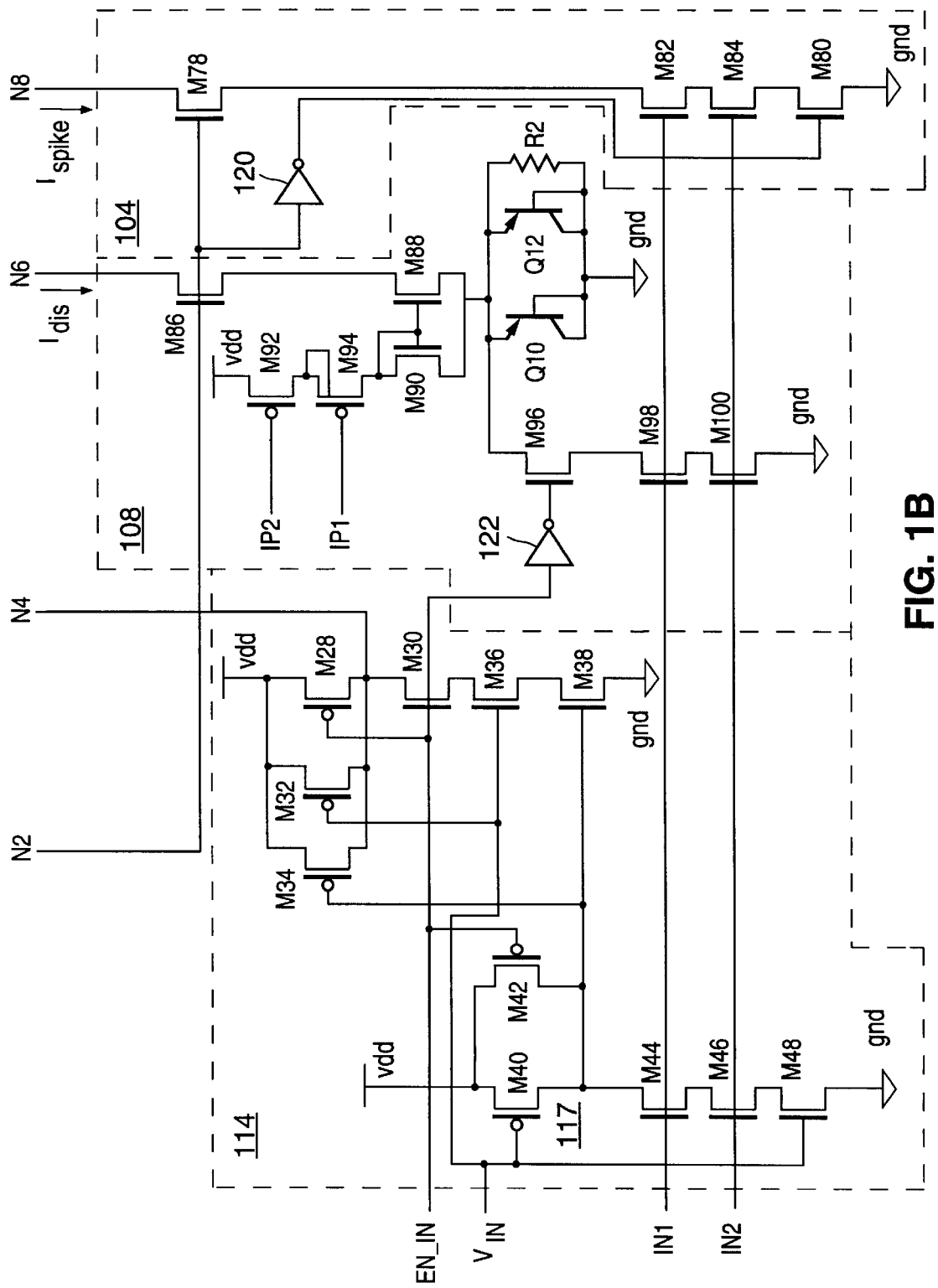

Referring to FIGS. 1A and 1B, there is shown a transmission line driver 100 in accordance with the present invention. The driver 100 is used for transferring data signals generated by a data system, such as a VLSI circuit, to a transmission line 102. The driver 100 has a programmable output voltage swing at output $V_{OUT}$, and it has programmable edge rate control. It is a high speed bus driver with fast turn-on and turn-off delay that may be operated at a data rate of 250 MHz or more, and it has low output pulse distortion. The driver 100 includes circuitry which makes it relatively insensitive to temperature, supply and process change.

The programmable edge rate control of the driver 100 tends to reduce the bus or transmission line ringing caused by reflections due to impedance mismatch. Furthermore, the ability to control the edge rate allows a longer stub length with less ringing and reduces far end and near end crosstalk. The far end crosstalk is directly proportional to edge rate. Ground bounce, supply ringing and electromagnetic interference are also reduced.

As will be discussed below, the driver 100 includes an output transistor M10 which is turned on to pull the output $V_{OUT}$ low and which is turned off to allow the output $V_{OUT}$ to go high. The gate voltage of the output transistor M10 has a fall time $T_f$ and a rise time $T_r$. In general, the longer the fall time $T_f$, the longer the on time $T_{on}$ of transistor M10, and the longer the rise time $T_r$, the longer the off time $T_{off}$ of transistor M10. If the rise time $T_r$ is equal to the fall time $T_f$, then the off time $T_{off}$ is greater than the on time $T_{on}$. The data rate is reduced when the ratio of fall time to rise time $T_f/T_r$ is increased.

The driver 100 functions as an inverter. It is designed to receive CMOS level binary signals, i.e., digital signals having a voltage swing of approximately 0 Volts (logic low) to 3.3 Volts (logic high), from a data system at the input $V_{IN}$. The driver 100 includes level shifting capability so that the data signals provided to the transmission line 102 via output $V_{OUT}$ operate within a different nominal voltage swing. The voltage swing of output voltage $V_{OUT}$ of the driver 100 is programmable. Specifically, output voltage $V_{OUT}$ may be programmed to be in accordance with the Backplane Transceiver Logic (BTL) standard, i.e., digital signals having a voltage swing of approximately 1.0 Volt (logic low) to 2.1 Volts (logic high). The voltage swing of output voltage $V_{OUT}$ of the driver 100 may also be programmed to the so called "GTL" or "GTL+" signal levels discussed above of 0.3 Volts±0.1 Volt (logic low) to 1.2 Volts±5% (logic high), depending upon supply voltage variations. In addition, the voltage swing of output voltage $V_{OUT}$ may be programmed to what is referred to herein as the "KTL," signal levels of 0.5 Volts (logic low) to 1.5 Volts (logic high). It is believed that a logic low value of 0.5 Volts, rather than 0.3 Volts, is better able to avoid interference caused by ground noise while also avoiding the performance disadvantages of a logic low value of 1.0 Volt. Thus, the output of the driver 100 may be programmed to be compatible with the BTL standard, the so called "GTL" and "GTL+" signal levels, or what is referred to herein as the "KTL" signal levels.

The transmission line 102 generally has a relatively low impedance and is terminated to voltage levels $V_T$. The transmission line 102 is typically a microstrip trace or a strip line trace having a characteristic impedance on the order of about 50Ω–70Ω. Normally, the transmission line 102 has its opposite ends terminated in its characteristic impedance so that the effective resistance of the parallel terminating resistors $R_T$ (only one resistor is shown) is approximately 25Ω–35Ω. If the driver 100 is programmed to operate at BTL signal levels, then the voltage $V_T$ is equal to 2.1 Volts; on the other hand, if the driver 100 is programmed to operate at GTL signal levels, then the voltage $V_T$ is equal to 1.2 Volts.

The driver 100 includes an output transistor M10, a main charging stage 106, a main charging stage pulse generation circuit 114, an initial charging stage 110, a charge holding stage 112, a main discharging stage 108, and a spike discharging stage 104. The main charging stage 106, the initial charging stage 110, and the charge holding stage 112 are responsive to data signals received at input $V_{IN}$ and cause the output transistor M10 to turn on to generate a logic low at the output node $V_{OUT}$. The main discharging stage 108 and the spike discharging stage 104 are responsive to data signals received at input $V_{IN}$ and cause the output transistor M10 to turn off to generate a logic high at the output node $V_{OUT}$.

The output transistor M10 is preferably a very wide channel, open drain, n-channel MOSFET. The drain of transistor-M10 is coupled to the transmission line 102 and the source is coupled to ground. The channel width of transistor M10 should be orders of magnitude greater than its channel length to reduce the effective resistance of its drain-source circuit during conduction. Preferably, transistor M10 has a channel width of 1600 μm and a channel length of 1 μm. Furthermore, although only a single transistor M10 is shown, it is to be understood that it may be fabricated by connecting any number of n-channel transistors in parallel with each other; such parallelism may be used for producing a transistor M10 of the desired effective channel width. For example, a second transistor M12 having a channel width of 400 μm and a channel length of 1 μm is shown connected in parallel with transistor M10.

Figure 3:
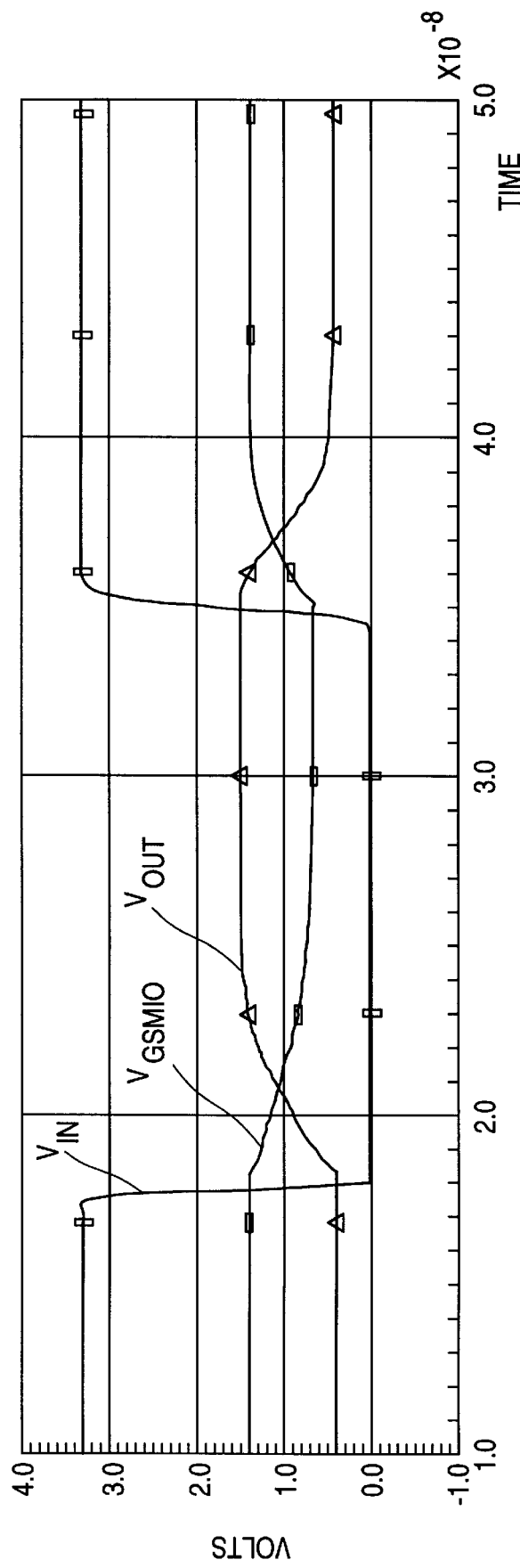
FIGS. 3, 4 and 5 are timing diagrams illustrating the operation of the transmission line driver shown in FIGS. 1A and 1B.
Figure 4:
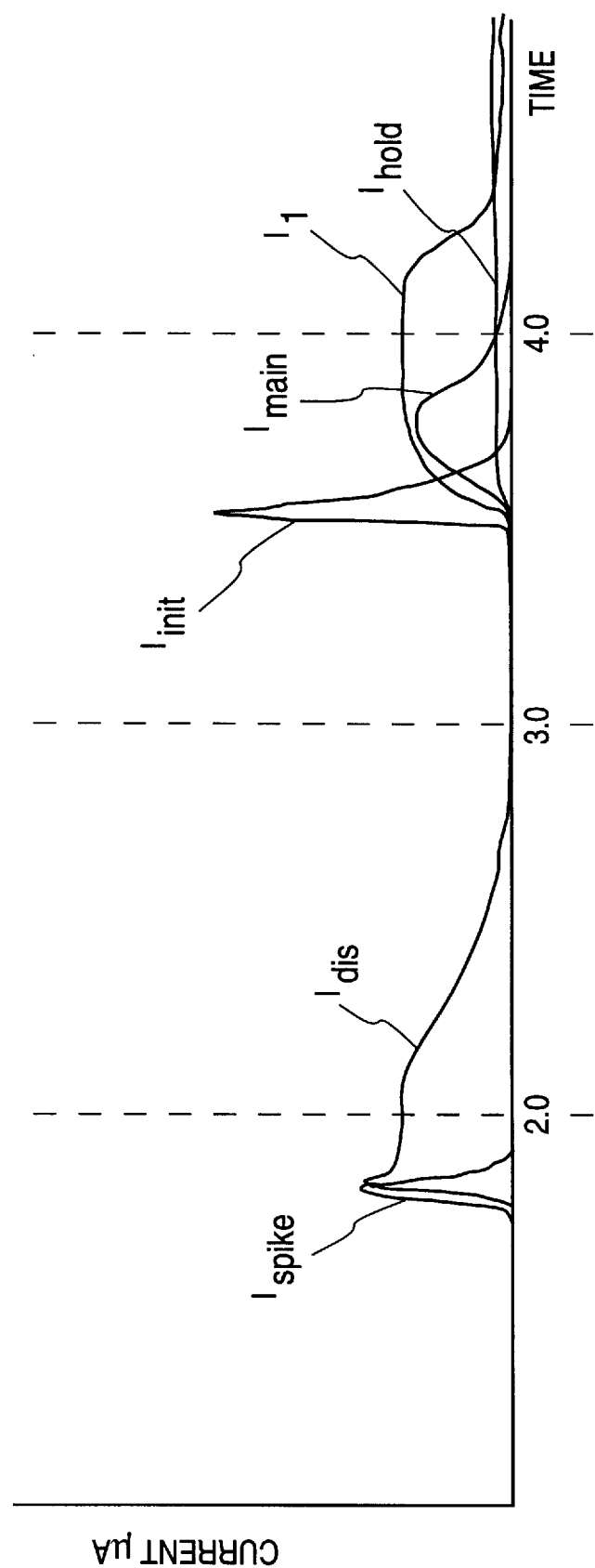
Figure 5:
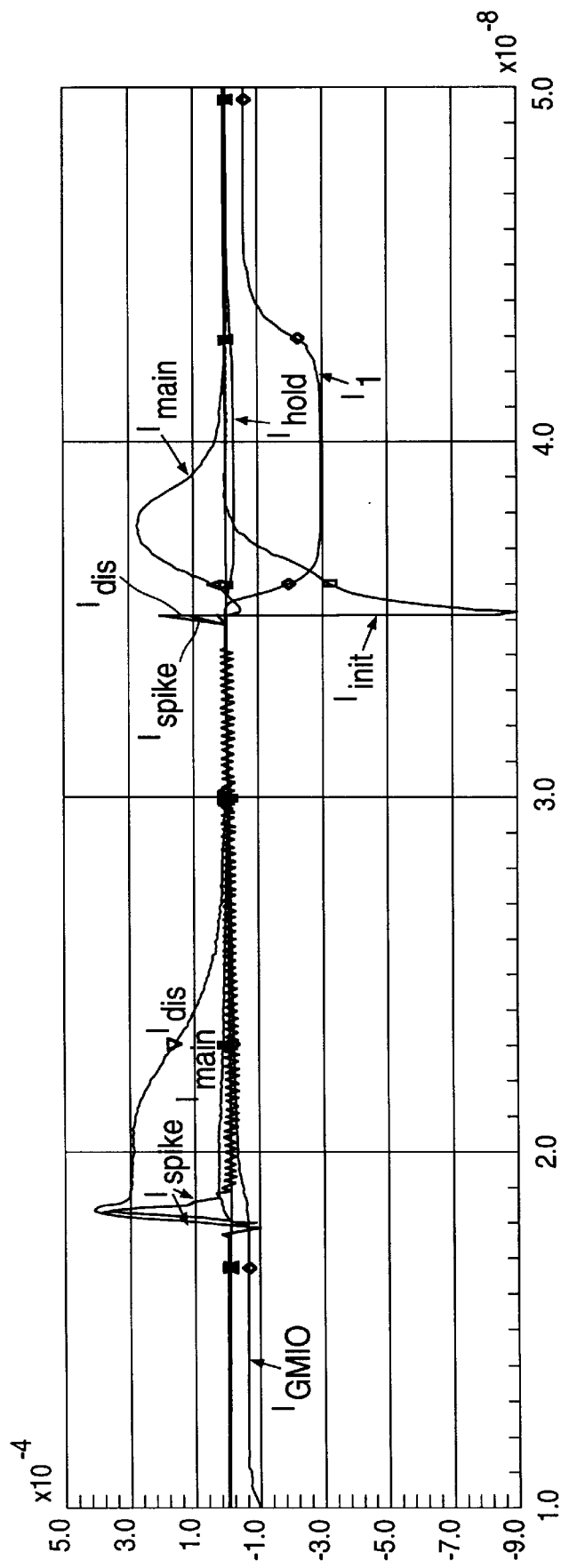

In order to understand the operation of the driver 100, reference should be made to the timing diagrams shown in FIGS. 3, 4 and 5, along with the schematic diagram shown in FIGS. 1A and 1B, during the following discussion.

The purpose of the main charging stage 106 is to provide a main charging current $I_{main}$ to the gate of transistor M10. Charging the gate of transistor M10 pulls it high which switches transistor M10 into a conducting state. Transistor M10 conducts current from the output node $V_{OUT}$ to ground.

Current flows through resistors $R_T$ and creates a voltage drop there across which causes the voltage at output $V_{OUT}$ to go low. A voltage sensing amplifier 116 is used for sensing when $V_{OUT}$ is approximately equal to its pre-programmed logical low level. The value of $V_{OUT}$ in its low state depends upon whether the driver 100 is programmed to be BTL or GTL compatible.

The main charging stage 106, which is turned on by the switching p-channel transistor M26, provides the main charging current $I_{main}$ to the gate of transistor M10 for a period of time not to exceed a main charging time period $t_{main}$. The main charging current $I_{main}$ is provided to the gate of transistor M10 long enough to switch it on. Once transistor M10 is switched into the conducting state, the main charging current $I_{main}$ is stopped in order to conserve power.

The main charging stage 106 includes a voltage sensing amplifier 116 having transistors M14, M16, M18, M20 connected substantially as shown. The voltage sensing amplifier 116 is a single stage CMOS differential amplifier. The amplifier 116 compares a reference input voltage $V_{REF}$ to the driver 100 output voltage $V_{OUT}$. The driver 100 is programmed to output BTL level signals by setting $V_{REF}$ equal to 1.0 Volt, KTL level signals by setting $V_{REF}$ equal to 0.5 Volts, and GTL level signals by setting $V_{REF}$ equal to 0.3 Volts. The amplifier 116 senses when the voltage at the output node $V_{OUT}$ is substantially equal to the programmed logical low level.

Two p-channel current source transistors M24, M22 are connected to the amplifier 116. The purpose of transistors M24, M22 is to compensate for variations in supply voltage and temperature. They are controlled by the current source outputs IP1/IP2, which will be discussed below. The current source outputs IP1/IP2, along with the current source transistors M22, M24, provide a means for adjusting the source-drain current $I_{SD}$ conducted by transistors M22, M24 to compensate for temperature and voltage supply $V_{DD}$ variations. The effects of temperature and supply voltage variations on MOSFET transistors, as well as the circuit which provides the current source outputs IP1/IP2, will be described in detail below. For the present discussion regarding the basic operation of the driver 100, however, it can be assumed that the outputs IP1/IP2 maintain a source-gate potential $V_{SG}$ on transistors M22, M24 such that they will conduct current whenever transistor M26 is turned on.

Transistor M26 may have a channel width of 200 μm and a channel length of 1 μm, transistors M22, M24 may have channel widths of 300 μm and channel lengths of 1 μm, transistors M14, M16 may have channel widths of 60 μm and channel lengths of 1 μm, and transistors M18, M20 may have channel widths of 50 μm and channel lengths of 1 μm.

The switching p-channel transistor M26 is controlled by the main charging stage pulse generation, circuit 114. The purpose of the main charging stage pulse generation circuitry 114 is to provide a main pulse to the gate of transistor M26. The main pulse is a negative pulse and has a length approximately equal to the main charging time period $t_{main}$. Because transistor M26 is a p-channel transistor, the negative main pulse turns transistor M26 on so that it conducts current for a period of time approximately equal to the main charging time period $t_{main}$. Therefore, the voltage sensing amplifier 116 conducts current to the gate of transistor M10 for a period of time that does not exceed the main charging time period $t_{main}$.

Specifically, the gate of transistor M26 is coupled to the drains of transistors M28, M30 via node N4. When the series connected transistors M30, M36, M38 are simultaneously turned on, the gate of the switching p-channel transistor M26 will be pulled down so that it is turned on, causing the current $I_1$ to flow. However, when any of the parallel connected transistors M28, M32, M34 are turned on, at least one of the series connected transistors M30, M36, M38 will be turned off, and the gate of the switching p-channel transistor M26 will be pulled high so that it is turned off, preventing the current $I_1$ from flowing. For example, when the EN_IN signal is low, transistor M28 is turned on and transistor M30 is turned off. This pulls the gate of transistor M26 high and disables the main charging stage 106. However, when the EN_IN signal is high, transistor M28 is turned off and transistor M30 is turned on. This permits the gate of transistor M26 to be pulled low when transistors M36, M38 are both turned on.

The main charging stage pulse generation circuitry 114 includes a p-channel transistor M40 and an n-channel transistor M48 connected to form a CMOS inverter 117. The input of the CMOS inverter 117 is connected to the input node $V_{IN}$ of the driver 100. The CMOS inverter 117 also includes two series connected current source transistors M44, M46 which are controlled by the current source outputs IN1/IN2, respectively (discussed below). The CMOS inverter 117 has a propagation delay that can be adjusted by adjusting the current source outputs IN1/IN2. Specifically, the current source outputs IN1/IN2 vary the gate voltages of transistors M44, M46, to compensate for temperature and supply voltage $V_{DD}$ variations. In addition, however, the current source outputs IN1/IN2 can be selectively programmed (discussed below) to be several different values, resulting in the gate voltages of transistors M44, M46 being programmable to several different values. By programming the gate voltages of transistors M44, M46, the current conducted by transistors M44, M46 is also thereby programmed.

The propagation delay of the CMOS inverter 117, i.e., the time between 50% of its input switching transition and 50% of its output switching transition, is dependent upon the speed at which its output goes high and low. The speed at which the output goes high and low depends upon the strength of the CMOS inverter 117 charging current conducted by transistor M40 and the strength of the CMOS inverter 117 discharging current conducted by transistor M48. The propagation delay of the CMOS inverter 117 will change if the charging and discharging currents are changed.

Because the current conducted by transistors M44, M46 is adjustable, the discharging current of the CMOS inverter 117 conducted by transistor M48 is also adjustable. By adjusting the discharging current of the CMOS inverter 117, the speed at which its output is pulled low is adjusted. Thus, the output high to low propagation delay time of the CMOS inverter 117 is adjustable by the current source outputs IN1/IN2.

The high to low propagation delay of the CMOS inverter 117 is approximately equal to the main charging time period $t_{main}$. Thus, the main charging time period $t_{main}$, which is the amount of time that transistor M26 is in the conducting state, is programmed by programming the high to low propagation delay of the CMOS inverter 117.

While the input $V_{IN}$ is low, transistor M36 is turned off and transistor M38 is turned on. Transistor M38 is turned on because the CMOS inverter 117 (i.e., transistors M40, M48) pulls the gate of transistor M38 high. Assuming that the EN_IN signal is high so that the circuit is enabled, when the input $V_{IN}$ changes from low to high, transistor M36 immediately turns on. Because of the delay caused by the CMOS inverter 117, transistor M38 remains turned on during this delay. This delay time is the main charging time period $t_{main}$. During the main charging time period $t_{main}$, transistors M36, M38 are simultaneously turned on and the gate of transistor M26 is pulled down so that it is turned on. However, the CMOS inverter 117 eventually (i.e., at the end of the main charging time period $t_{main}$) pulls the gate of transistor M38 down so that it turns off. When this happens, transistor M34 turns on and pulls the gate of transistor M26 high so that it turns off, causing the current $I_1$ to stop flowing.

During the main charging time period $t_{main}$ when transistor M26 is turned on, the output high-to-low transition current $I_1$ is regulated by the output voltage $V_{OUT}$ through the differential transistor pair M14, M16. The main charging current $I_{main}$ reaches its maximum level, i.e., equal to current $I_1$, when the output voltage $V_{OUT}$ is at its highest level. The current $I_1$ is regulated in such a way that the driver output voltage $V_{OUT}$ has a smooth high-to-low transition. When the output voltage $V_{OUT}$ decreases to the reference voltage level $V_{REF}$, i.e., 1.0V for BTL, 0.5V for KTL and 0.3V for GTL, the current $I_1$ drops to zero and the gate voltage of transistor M10 stops rising. Therefore, the output voltage $V_{OUT}$ is clamped to the reference voltage level $V_{REF}$.

Transistors M28, M34 may have channel widths of 10 $\mu$m and channel lengths of 1 $\mu$m, transistor M32 may have a channel width of 15 $\mu$m and a channel length of 1 $\mu$m, transistors M36, M38 may have channel widths of 100 $\mu$m and channel lengths of 1 $\mu$m, transistors M40, M42 may have channel widths of 5 $\mu$m and channel lengths of 1 $\mu$m, transistors M44, M46 may have channel widths of 70 $\mu$m and channel lengths of 1 $\mu$m, and transistor M48 may have a channel width of 20 $\mu$m and a channel length of 1 $\mu$m.

The purpose of the initial charging stage 110 is to provide an initial charging current $I_{init}$ to the gate of transistor M10 for a period of time not to exceed an initial charging time period $t_{init}$. The initial charging time period $t_{init}$ is shorter than the main charging time period $t_{main}$. The initial charging current $I_{init}$ quickly charges the gate of transistor M10 up to the point where the gate-source voltage is approximately equal to the threshold voltage $V_{TH}$. In other words, the initial charging current $I_{init}$ quickly increases the gate voltage of transistor M10 to the point where transistor M10 starts conducting current and pulling output $V_{OUT}$ low. The initial charging time period $t_{init}$ has length approximately equal to the period of time necessary to increase the gate voltage of transistor M10 from ground to the threshold level $V_{TH}$.

The initial charging stage 110 includes two p-channel switching transistors M50, M52 and two p-channel current source transistors M58, M60, all connected in series as shown. The gates of transistors M58, M60 are connected to current source outputs IPUL1/IPUL2 to compensate the initial charging stage 110 for temperature and supply voltage $V_{DD}$ variations. The gate of transistor M52 is connected to the drains of transistors M62, M64, which form an inverter, the input of which is connected to the input $V_{IN}$. The gate of transistor M50 is connected to the drains of transistors M54, M56, which form an inverter, the input of which is connected to the drains of transistors M62, M64. When the input $V_{IN}$ changes state from low to high, transistor M52 turns on. Transistor M50 remains turned on until transistor M54 pulls the gate of transistor M50 high after a delay. This delay period is the initial charging time period $t_{init}$. In other words, switching transistors M50, M52 are in simultaneous conducting states for the initial charging time period $t_{init}$. Thus, transistors M50, M52, M58, M60 are all in the conducting state, and the initial stage charging current $I_{init}$ is provided to the gate of transistor M10, for a period of time equal to the delay of the inverter formed by transistors M54, M56, or the initial charging time period $t_{init}$.

Transistors M58, M60 may have channel widths of 160 $\mu$m and channel lengths of 1 $\mu$m, transistor M50 may have a channel width of 50 μm and a channel length of 1 μm, transistor M52 may have a channel width of 40 μm and a channel length of 1 μm, transistor M54 may have a channel width of 10 μm and a channel length of 4 μm, and transistor M56 may have a channel width of 5 μm and a channel length of 1 μm.

The charge holding stage 112 provides the current $I_{hold}$ to the gate of transistor M10 and is used to hold the gate of transistor M10 high after the currents $I_{init}$ and $I_{main}$ turn off. A switching p-channel transistor M72 has its gate coupled the drains of transistors M62, M64. As long as the input $V_{IN}$ is high, the gate of transistor M72 is pulled low so that transistor M72 is turned on. The current source transistors M76, M74 are controlled by the current source outputs IP1/IP2, respectively. When transistors M72, M74, M76 are all turned on, the current $I_{hold}$ is conducted to the gate of transistor M10. The current $I_{hold}$ flows as long as the input $V_{IN}$ is high (and the EN_IN signal is also high). Furthermore, after current $I_1$ stops flowing, the current $I_{hold}$ flows through transistor M20 in order to find a path to ground.

Transistors M74, M76 may have channel widths of 24 μm and channel lengths of 1 μm, and transistor M72 may have a channel width of 6 μm and a channel length of 1 μm.

When the input $V_{IN}$ goes low, the spike discharging stage 104 provides a spike discharging, or turn-off, current $I_{spike}$ to reduce the output transistor M10's turn-off delay. The spike discharging stage 104 includes the n-channel switching transistors M78, M80, the inverter 120, and the n-channel current source transistors M82, M84 connected substantially as shown. The spike discharging current $I_{spike}$ is only conducted while transistors M78, M80 are in simultaneous conducting states. When the input $V_{IN}$ goes low, transistor M78 immediately turns on, and transistor M80 turns off after the delay caused by the inverter 120. The period of time during which the spike discharging current $I_{spike}$ is conducted is the time period $t_{spike}$, i.e., the gate delay of the inverter 120. The spike discharging current $I_{spike}$ reduces transistor M10's turn-off delay in such a way that the driver output $V_{OUT}$ has a monotonic rising transition. Thus, the spike discharging current $I_{spike}$ is controlled by the gate delay of the inverter 120.

Transistor M78 may have a channel width of 10 μm and a channel length of 1 μm, transistor M80 may have a channel width of 30 μm and a channel length of 1 μm, and transistors M82, M84 may have channel widths of 60 μm and channel lengths of 1 μm. The n-channel transistor included in the inverter 120 may have a channel width of 5 μm and a channel length of 1 μm, and the p-channel transistor included in the inverter 120 may have a channel width of 10 μm and a channel length of 1 μm.

The purpose of the main discharging stage 108 is to provide a discharging current $I_{dis}$ from the gate of transistor M10 to ground in order to continue the output $V_{OUT}$ low-to-high transition. Discharging the gate of transistor M10 switches it into a non-conducting state. When transistor M10 is in a non-conducting state, current is no longer conducted from output $V_{OUT}$ to ground. This causes output $V_{OUT}$ to go high because current stops flowing through resistor $R_T$. The value of $V_{OUT}$ in its high state depends upon whether the driver 100 is programmed to be BTL, KTL or GTL compatible.

The main discharging stage 108 includes an n-channel switching transistor M86 having its gate coupled to the drains of transistors M62, M64 via node N2. When the input $V_{IN}$ goes low, transistor M86 turns on and the discharging current $I_{dis}$ begins to flow. The discharging current $I_{dis}$ discharges the gate of transistor M10 in order to reduce its gate-source voltage $V_{GS}$. Two n-channel transistors M88, M90 form a current mirror with transistor M88 being coupled to transistor M86 in order to conduct the discharging current $I_{dis}$. Transistor M90 is coupled to two p-channel current source transistors M94, M92 which are controlled by the current source outputs IP1/IP2, respectively. Because of the current mirror formed by transistors M88, M90, the discharging current $I_{dis}$ is controlled by the current conducted by the current source transistors M92, M94.

The sources of transistors M88, M90 are coupled to the emitters of two parasitic pnp transistors Q10, Q12, as well as a resistor R2. Transistors Q10, Q12 are preferably each formed from a PMOS transistor instead of using bipolar transistors. Specifically, the drain of a PMOS transistor is used as the collector, the source of the PMOS transistor is used as the emitter, and the n type substrate of the PMOS transistor is used as the base. By using a PMOS transistor instead of bipolar transistors, die area and power consumption is conserved.

Transistors Q10, Q12 and resistor R2 form a clamping circuit which clamps the gate-source voltage $V_{GS}$ of transistor M10 to a first voltage level to prevent the discharge current $I_{dis}$ from reducing the gate-source voltage $V_{GS}$ of transistor M10 all the way to ground. Transistors Q10, Q12 are diode connected, i.e., each has its base coupled to its collector, and the collectors are both coupled to ground. Because of the diode connections of transistors Q10, Q12, the transistors are effectively being used as p-n junctions similar to a regular diode. The purpose of transistors Q10, Q12 is clamp the gate-source voltage $V_{GS}$ of transistor M10 to a voltage level equal to the base-emitter voltage $V_{BE}$ of transistors Q10, Q12. This way, the gate-source voltage $V_{GS}$ of transistor M10 does not decrease all the way to zero, and the turn-on delay of transistor M10 is significantly reduced.

Additionally, the sources of transistors M88, M90 are coupled to an n-channel transistor M96 which is part of a bypass circuit which is controlled by the enable input EN_IN. The bypass transistor M96 is coupled to the emitters of the clamping transistors Q10, Q12 and bypasses the clamping circuit so that the discharge current $I_{dis}$ can reduce the gate-source voltage $V_{GS}$ of the output transistor M10 down to a second voltage level that is less than the base-emitter voltages of transistors Q10, Q12. The bypass transistor M96 is responsive to signals applied to the enable input EN_IN and is coupled so that its current conducting channel provides a less resistive path to ground for the discharge current $I_{dis}$ than the clamping transistors Q10, Q12.

The gate of transistor M96 is coupled to an inverter 122 which has its input coupled to the enable input EN_IN. Two current source transistors M98, M100 are coupled in series with the source of transistor M96. When the EN_IN input is low, the circuit is disabled because transistor M96 turns on and shunts the current conducted by transistors M88, M90 to ground. This forces the gate-source voltage $V_{GS}$ of transistor M10 low enough to ensure that the drain current of transistor M10 is less than 100 μa, which is compatible with the BTL output leakage current specification. Thus, the leakage current of transistors M10 is controlled. On the other hand, when the EN_IN input is high, the circuit is enabled because transistor M96 turns off and the current conducted by transistors M88, M90 is conducted by transistors Q10, Q12, and resistor R2 which clamps the gate of transistor M10 at the base-emitter voltage $V_{BE}$ level.

Transistor M86 may have a channel width of 20 μm and a channel length of 1 μm, transistor M88 may have a channel width of 60 μm and a channel length of 1 μm, transistor M90 may have a channel width of 12 μm and a channel length of 1 μm, transistors M92, M94 may have channel widths of 50 μm and channel lengths of 1 μm, transistor M96 may have a channel width of 20 μm and a channel length of 1 μm, and transistors M98, M100 may have channel widths of 25 μm and channel lengths of 1 μm. The n-channel transistor included in the inverter 122 may have a channel width of 5 μm and a channel length of 1 μm, and the p-channel transistor included in the inverter 120 may have a channel width of 10 μm and a channel length of 1 μm. Resistor R2 may have a value of 40K Ω. Transistors Q10, Q12 may each have an emitter width of 30 μm and an emitter length of 30 μm.

Transistors M66, M68 form an enable circuit, and transistors M62, M64 form an input circuit inverter 124. When the data input $V_{IN}$ goes high, the gates of transistors M78, M86 are pulled low by inverter 124. Because transistors M78, M86 are turned off, the currents $I_{dis}$ and $I_{spike}$ do not flow. Meanwhile, transistor M36 turns on. Because transistors M30, M38 are already turned on, the gate of transistor M26 is pulled low which turns it on. This allows the current $I_1$ to be regulated by the driver output $V_{OUT}$. The resulting regulated main charging current $I_{main}$ controls the driver output $V_{OUT}$ high-to-low transition. The main charging current $I_{main}$ continues to flow until transistor M38 is turned off by inverter 117. This occurs after a period of time equal to the main charging time period $t_{main}$.

When the data input $V_{IN}$ goes low, transistor M32 turns on and transistor M36 turns off which prevents transistors M26 from turning back on. Meanwhile, transistors M78, M86 both turn on due to the output of inverter 124 going high. The spike discharge current $I_{spike}$ flows for the time period $t_{spike}$ as discussed above. The main discharge current $I_{dis}$ turns on and is controlled by the reference current generated by current source transistors M92, M94 through the current mirroring performed by transistors M88, M90. Thus, the reference current generated by current source transistors M92, M94 determines the driver output $V_{OUT}$ rising transition. The gate-source voltage $V_{GS}$ of transistor M10 decreases until it is clamped at the base-emitter voltage $V_{BE}$ of transistors Q10, Q12. Because the gate-source voltage $V_{GS}$ of transistor M10 does not decrease all the way to zero, the turn-on delay of transistor M10 is significantly reduced.

Transistor M62 may have a channel width of 20 μm and a channel length of 1 μm, transistor M64 may have a channel width of 40 μm and a channel length of 1 μm, transistor M66 may have a channel width of 80 μm and a channel length of 1 μm, and transistor M68 may have a channel width of 10 μm and a channel length of 1 μm.

Figure 2A:
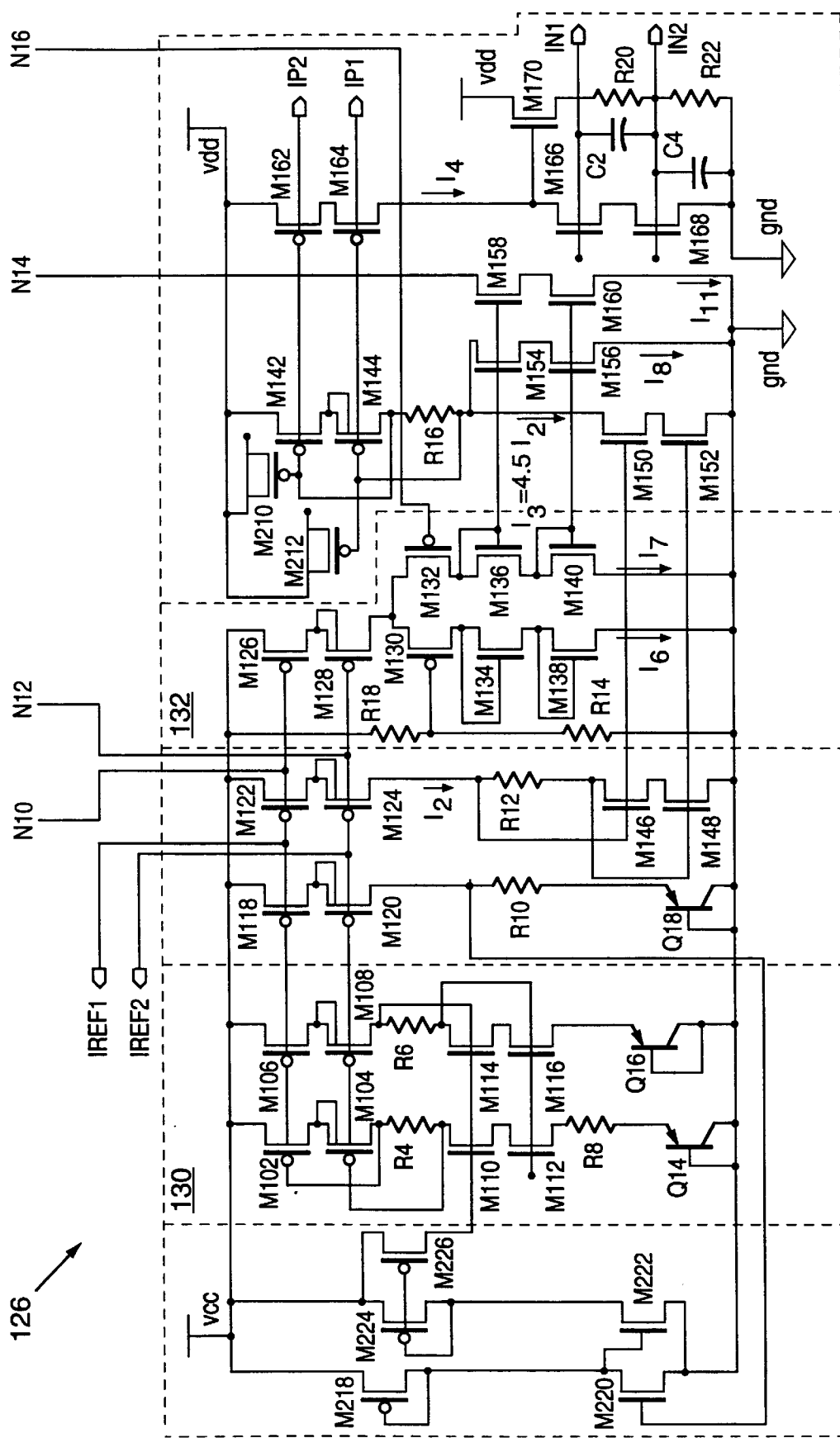

Referring to FIGS. 2A, 2B and 2C the current source 126, 128, 130 provides a means for adjusting the currents conducted by various transistors in the driver 100 shown in FIGS. 1A and 1B. The current source 126 generates outputs having a positive temperature coefficient and compensates for temperature and supply voltage $V_{DD}$ variations. Use of the current source 126 with the driver 100 prevents the problematic variations in rise-time $t_r$ and fall time $t_f$ due to variations in temperature and voltage supply $V_{DD}$ that plague prior art bipolar drivers.

Temperature variations affect the performance of FETs. Temperature variations may be in the form of ambient temperature variations, i.e., variations in the temperature of the air surrounding integrated circuits, and/or junction temperature variations, i.e., variations in the temperature of the silicon in an integrated circuit. Ambient temperature variations can cause junction temperature variations, and vice versa.

FET performance is affected because temperature variations tend to cause the transconductance $g_m$ of the transistors to vary. The amount of current that is conducted by a transistor's current conducting channel, i.e., the current conducted between the drain and source ($I_{DS}$ for n-channel and $I_{SD}$ for p-channel), is determined in part by $g_m$. In the case of a MOSFET, when temperature increases, transconductance $g_m$ decreases which causes currents $I_{DS}$ and $I_{SD}$ to decrease. On the other hand, when temperature decreases, transconductance $g_m$ increases which causes $I_{DS}$ and $I_{SD}$ to increase. Thus, it may be said that the current conducted by the channel of a MOSFET has a negative temperature coefficient. Furthermore, $I_{DS}$, $I_{SD}$, and $g_m$ vary linearly with temperature variations.

Logic gates, such as the driver 100, are typically constructed from several transistors. The speed of a logic gate is determined in part by the $I_{DS}$ of the individual transistors, which results in gate speed being proportional to $g_m$. If the $g_m$ of each transistor in a logic gate varies with temperature, then the $I_{DS}$ of each transistor also varies which causes the speed of the logic gate to vary with temperature. For example, when temperature increases, gate speed decreases, and when temperature decreases, gate speed increases.

Variations in gate speed due to temperature variations is an undesirable characteristic because such variations can adversely affect the synchronized timing operations of a digital system. Digital systems can be designed to operate more efficiently if the designer can be assured that gate speed will remain constant. Gate speed can be kept relatively constant if temperature is kept constant. However, because digital systems must operate in a variety of environments, ambient and junction temperature cannot always be controlled. A relatively constant logic gate speed can be maintained during temperature variations if the current conducted by the conducting channels of a logic gate's MOSFET transistors is maintained at relatively constant levels despite the temperature variations.

FIGS. 2A, 2B and 2C show the detailed structure of the programmable current source 126, 128, 130 which includes several outputs used for compensating for temperature and/or supply voltage $V_{DD}$ variations. The current source outputs IP1/IP2, IN1/IN2 and IPUL1/IPUL2 are used to bias the current source transistors shown in FIGS. 1A and 1B. Specifically, the various pairs of outputs IP1/IP2, IN1/IN2, and IPUL1/IPUL2 are used adjust the currents $I_{DS}$ (or $I_{SD}$) generated by the transistors to which the outputs are coupled. All of the current source outputs have a positive temperature coefficient to compensate for the speed degradation due to temperature change. The current source 126, 128, 130 is part of what enables the driver 100's edge rate control.

The current source outputs IP1/IP2, IN1/IN2 and IPUL1/IPUL2 are generated in pairs, i.e., two series connected transistors are used to generate IP1/IP2, two series connected transistors are used to generate IN1/IN2, and so on. One purpose of generating the outputs in pairs is to make the outputs independent of variations in voltage supply $V_{DD}$. By using two transistors in cascode, changes in the voltage supply $V_{DD}$ do not affect the current conducted by the two transistors as much as such changes would affect the current conducted by one transistor. Thus, improved supply voltage $V_{DD}$ compensation is believed to be achieved by using two transistors in cascode and generating the outputs in pairs.

In general, the outputs IP1/IP2 adjust the $I_{SD}$ generated by transistors M24, M22, M76, M74, M94, M92 to compensate for variations in temperature and voltage supply $V_{DD}$ by adjusting each transistor's gate voltage in response to such variations. Because transistors M24, M22, M76, M74, M94, M92 are p-channel MOSFETs, when temperature increases, the outputs IP1/IP2 adjust the gate voltage of the transistors so that the source-gate voltage $V_{SG}$ of each transistor increases. By increasing the source-gate voltages, more current $I_{SD}$ will be conducted by the transistors' conducting channel which will compensate for the decrease in current $I_{SD}$ due to the increase in temperature. On the other hand, when temperature decreases, the outputs IP1/IP2 adjust the gate voltages of transistors M24, M22, M76, M74, M94, M92 so that the source-gate voltages $V_{SG}$ decrease. By decreasing the source-gate voltages, less current $I_{SD}$ will be conducted by the transistors' conducting channel which will compensate for the increase in current $I_{SD}$ due to the decrease in temperature.

The outputs IN1/IN2 are for adjusting the gate voltages of the n-channel MOSFETs M44, M46, M98, M100, M82, M84 to compensate for temperature and supply voltage $V_{DD}$ variations. When temperature increases, the outputs IN1/IN2 increases the gate-source voltage $V_{GS}$ of each of the transistors which causes more current $I_{DS}$ to be conducted by the transistors' conducting channels. The, increase in current $I_{DS}$ compensates for the decrease in current $I_{DS}$ due to the increase in temperature. On the other hand, when temperature decreases, the outputs IN1/IN2 decreases the gate-source voltage $V_{GS}$ of each transistor which causes less current $I_{DS}$ to be conducted by the transistors' conducting channels. The decrease in current $I_{DS}$ compensates for the increase in current $I_{DS}$ due to the decrease in temperature.

The gate-source (or source-gate) voltages of transistors M24, M22, M76, M74, M94, M92, M44, M46, M98, M100, M82, M84 may be adjusted (via IP1/IP2, IN1/IN2) so that the currents conducted by those transistors are maintained at relatively constant levels during temperature variations. Preferably, however, gate-source (or source-gate) voltages are adjusted so that the currents conducted by those transistors actually increase during temperature increases and decrease during temperature decreases. In the later scenario, gate-source (or source-gate) are simply increased or decreased slightly more than they would be in the first scenario. Increasing or decreasing the currents conducted by the transistors according to the later scenario tends to compensate other transistors in the driver 100 that have no direct temperature compensation system. For example, increasing the currents conducted by the compensated transistors in response to a temperature increase will tend to increase the current conducted by the other uncompensated MOSFETs in the circuit.

The programmable current source 126 includes a positive temperature coefficient current generation stage 130, or bandgap current source 130. The current generation stage 130 is an important component of the current source 126 because it generates a source-drain current $I_{M106}$ in transistor M106 that has a positive temperature coefficient. In other words, when temperature increases, current $I_{M106}$ increases, and when temperature decreases, current $I_{M106}$ decreases. As discussed above, the current conducted by the channel of a MOSFET normally has a negative temperature coefficient. Because current $I_{M106}$ has a positive temperature coefficient, the outputs IP1/IP2, IN1/IN2 also have a positive temperature coefficient and are able to compensate for temperature variations.

The current generation stage 130 generates the positive temperature coefficient current $I_{M106}$ as follows. The bandgap current source includes two sets of cascode current mirror pair transistors: the PMOS transistors M102/M104 and M106/M108, and the NMOS transistors M110/M112 and M114/M116. FurtherMore, 2 pnp transistors Q14, Q16 having a 10/1 ratio, and one current set resistor R8 are also included. The cascode current mirror pair transistors enhance current source dynamic output impedance so that the output value is insensitive to voltage supply change. This ensures that the driver 100 output delay and transition time are independent of supply voltage variation.

Transistors M102, M106 generate and maintain two substantially equal currents $I_{R4}$, $I_{R6}$ that are conducted by resistors R4, R6, respectively. When the strength of one of these currents changes, the strength of the other current changes so that they remain substantially equal. The currents $I_{R4}$, $I_{R6}$ increase in response to an increase in temperature and decreases in response to a decrease in temperature; thus, they each have a positive temperature coefficient.

The drain-source current $I_{DS}$ of a MOSFET normally has a negative temperature coefficient, i.e., as temperature increases, current $I_{DS}$ decreases. However, the source-drain current $I_{M106}$ of transistor M106 has a positive temperature coefficient, i.e., as temperature increases, current $I_{M106}$ increases. This phenomenon that occurs in the current generation stage 130 permits the other components of the current source 126 to provide outputs which adjust the gate voltage of MOSFETs in order to compensate for variations in temperature.

The positive temperature coefficient current generation stage 130 is normally not affected by variations in supply voltage $V_{DD}$, i.e., the stage 130 operates independently of supply voltage $V_{DD}$. Specifically, transistors M102, M106 operate in the saturation range while conducting current. If the supply voltage $V_{DD}$ changes, then the source-drain voltages $V_{SD}$ of each transistor M102, M106 also changes because the drains of transistors M102, M106 are high impedance. However, the currents conducted therethrough do not change because the transistors M102, M106 are operating in saturation. Thus, the currents conducted by transistors M102, M106 not only have a positive temperature coefficient, but they are also not affected by variations in voltage supply $V_{DD}$. Therefore, the current source 126 also compensates for variations in supply voltage $V_{DD}$.

Transistors M102, M104, M106, M108 may have channel widths of 1200 $\mu$m and channel lengths of 3 $\mu$m, and transistors M110, M112, M114, M116 may have channel widths of 400 $\mu$m and channel lengths of 2 $\mu$m. Resistors R4, R6 may have values of 4K$\Omega$, and resistor R8 may have a value of 1K$\Omega$. Transistors Q14, Q16 are preferably pnp transistors each having an emitter width of 3 $\mu$m and an emitter length of 3 $\mu$m.

The current $I_{M106}$ is reflected to the current $I_2$ via the current mirror transistors M122/M124 and M106/M108. Furthermore, the current $I_2$, which is equal to (kT/q)(Ln10/R8), is reflected to the current $I_3=4.5I_2$ via the cascode current mirror transistors M150/M152 and M146/M148. Transistors M122, M124 may have channel widths of 1200 $\mu$m and channel lengths of 3 $\mu$m, transistors M118, M120 may have channel widths of 400 $\mu$m and channel lengths of 3 $\mu$m, transistors M146, M148 may have channel widths of 100 $\mu$m and channel lengths of 2 $\mu$m, and transistors M150, M152 may have channel widths of 450 $\mu$m and channel lengths of 2 $\mu$m.

The current $I_4$, which is used to generate the outputs IP1/IP2, IN1/IN2, is the result of the combination of currents $I_3$ and $I_8$ being reflected via the current mirror transistors M162/M164 and M142/M144. Transistors M142, M144 may have channel widths of 400 $\mu$m and channel lengths of 1 μm, and transistors M162, M164 may have channel widths of 400 μm and channel lengths of 1 μm. Resistor R16 may have a value of 1KΩ.

The current $I_4$ is adjustable in order to control the edge rate of the driver 100. The current $I_4$ is adjusted by adjusting the current $I_8$ via the edge rate control stage 132. The edge rate control stage 132 is programmable and can be programmed to generate alternative values of the output currents $I_4$, $I_{12}$ so that corresponding alternative values of gate voltage are applied to the current source transistors to which the outputs IP1/IP2, IN1/IN2, IPUL1/IPUL2 are coupled. This results in corresponding alternative values of current being conducted by the current source transistors to which the outputs IP1/IP2, IN1/IN2, IPUL1/IPUL2 are coupled. The edge rate control stage 132 includes two transistors M126, M128 which form a current mirror with transistors M106, M108. The current conducted by transistors M126, M128 provides current to two separate current paths which conduct the currents $I_6$ and $I_7$. The strengths of the currents $I_6$ and $I_7$ relative to each other is controlled by controlling the gate voltage of transistor M132. Transistors M126, M128 may have channel widths of 1200 μm and channel lengths of 3 μm, transistors M130, M132 may have channel widths of 40 μm and channel lengths of 1 μm, and transistors M134, M136, M138, M140 may have channel widths of 100 μm and channel lengths of 2 μm. Resistors R14, R18 each may have a value of 50KΩ.

The gate voltage of transistor M132 is controlled via node N16 by the resistor network 134 shown in FIG. 2C. In the embodiment of the invention described herein, there are three different settings: (1) when the EDGE_CON input of the network 134 is grounded, current $I_7$ is greater than current $I_6$; (2) when the EDGE_CON input of the network 134 is floating, current $I_7$ is equal to current $I_6$; and (3) when the EDGE_CON input of the network 134 is tied to $V_{DD}$, current $I_6$ is greater than current $I_7$. These three different settings provide three different values for the current $I_8$ which is conducted by transistors M154, M156. The gate voltages of transistors M154, M156 are controlled by transistors M136, M140 of the edge rate control stage 132. Variations in the current $I_8$ cause the current $I_4$ to vary. The current $I_4$ is calculated as follows:

| | |
|---|---|
| Max $I_4$ = 4.5 $I_2$ + 4.5 $I_2$ 9 ($I_2$) | Assume EDGE_CON pin is grounded |
| Med $I_4$ = 4.5 $I_2$ + 4.5/2 $I_2$ = 3/2 (4.5 $I_2$) | Assume EDGE_CON pin is floating |
| Min $I_4$ = 4.5 $I_2$ + 0 = 4.5 ($I_2$) | Assume EDGE_CON pin is tied to $V_{DD}$ |

These three settings for the current $I_4$ provide three different settings for the edge rate of the driver 100.

Transistors M154, M156 may have channel widths of 450 μm and channel lengths of 2 μm, transistors M158, M160 may have channel widths of 230 μm and channel lengths of 2 μm, transistors M166, M168 may have channel widths of 200 μm and channel lengths of 1 μm, and transistor M170 may have a channel width of 2000 μm and a channel length of 1 μm. Resistors R34, R36 may each have a value of 50KΩ, resistors R38, R40 may each have a value of 100KΩ, resistor R42 may have a value of 12.5KΩ, resistor R20 may have a value of 1KΩ, and resistor R22 may have a value of 5KΩ. Capacitors C2, C4 may each have a value of 4 picofarads, and capacitor C6 may have a value of 8 picofarads.

The outputs IP1/IP2 are taken from the gates of transistors M162, M164. These outputs compensate for variations in temperature and supply voltage. The outputs IN1/IN2 are taken from the gates of transistors M166, M168 and also compensate for variations in temperature and supply voltage.

As will be discussed below, the outputs IN1/IN2 are low impedance outputs due to the resistors R20, R22 and transistor M170.

Referring to FIG. 2B, transistors M172, M174 have their gates coupled to the gates of transistors M122, M124 via nodes N10, N12, respectively. The current $I_9$ conducted by transistors M172, M174 is reflected to current $I_{10}$ via current mirror transistors M184/M186 and M176/M178. The current $I_{12}$ conducted by transistors M180, M182 is equal to the sum of currents $I_{10}$ and $I_{11}$. The current $I_{11}$ is adjusted by the edge rate control stage 132 similar to the current $I_8$. Thus, the current $I_{12}$ is adjustable by the edge rate control stage 132 in a manner similar to current $I_4$.

Transistors M172, M174 may have channel widths of 1200 μm and channel lengths of 3 μm, transistors M176, M178 may have channel widths of 100 μm and channel lengths of 2 μm, transistors M184, M186 may have channel widths of 670 μm and channel lengths of 2 μm, and transistors M180, M182 may have channel widths of 400 μm and channel lengths of 1 μm. Resistor R24 may have a value of 4KΩ, and resistor R26 may have a value of 1KΩ.

The gates of transistors M180, M182 are coupled to a voltage supply compensation stage 136. The voltage supply compensation stage 136 causes the current $I_5$, and thus the outputs IPUL1/IPUL2, to be dependent upon the supply voltage $V_{DD}$. In other words, the current $I_5$ reversively, or inversely, changes with the voltage supply $V_{DD}$. This is useful because the initial charging current $I_{init}$ (shown in FIG. 1A) contains the parasitic current of transistor M52's drain junction capacitance $$c \frac{dv}{dt},.$$

The higher the voltage supply $V_{DD}$, the higher the parasitic current. To compensate this undesirable increase in current, the current $I_5$ is reduced through the voltage supply compensation stage 136 which, via the current source outputs IPUL1/IPUL2, causes the initial charging current $I_{init}$ to actually be insensitive to voltage supply $V_{DD}$ change. Thus, the output stage 138 is a supply voltage dependent current source and the outputs IPUL1/IPUL2 adjust the gate voltages of transistors M58, M60 in response to an increase in the supply voltage $V_{DD}$ so that the initial charging current $I_{init}$ is maintained at a relatively constant level in response to increases in the supply voltage $V_{DD}$.

Transistors M188, M190 may have channel widths of 80 μm and channel lengths of 1 μm, transistors M192, M196 may have channel widths of 40 μm and channel lengths of 2 μm, and transistor M194 may have a channel width of 26 μm and a channel length of 2 μm. Resistor R28 may have a value of 40KΩ.

An output stage 138 provides the current source outputs IPUL1/IPUL2 to be low impedance. As mentioned above, the current source outputs IN1/IN2 are also low impedance. Since the current source outputs IPUL1/IPUL2, IN1/IN2 are used in multiple transmission line drivers, for example in an 18 channel driver, the output impedance should be kept as low as possible to reduce feedback coupling from node voltage switching. Such node voltage switching coupling can create severe driver output distortion if the source outputs do not have a low impedance discharge path. Source follower transistors M204, M170 and their associated resistors are designed to serve this purpose.

Transistors M198, M200 may have channel widths of 160 μm and channel lengths of 1 μm, transistor M202 may have a channel width of 140 μm and a channel length of 2 μm, and transistor M204 may have a channel width of 2000 μm and a channel length of 1 μm. Resistor R30 may have a value of 2.5KΩ, and resistor R32 may have a value of 0.5KΩ.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A driver for providing binary signals from a data system to a transmission line, the driver comprising:

a data input node;

an output transistor coupled between a data output node and ground, the output transistor having a gate, a source and a corresponding gate-source voltage therebetween;

a first transistor, coupled to the gate of the output transistor and responsive to signals applied to the input node, for conducting a discharge current from the gate of the output transistor for discharging the gate of the output transistor to reduce its gate-source voltage; and a clamping circuit connected between the first transistor and ground which carries the discharge current conducted by the first transistor to ground, the clamping circuit configured to clamp the gate-source voltage of the output transistor to a first voltage level above ground to prevent the discharge current from reducing the gate-source voltage of the output transistor to ground.

2. A driver for providing binary signals from a data system to a transmission line, the driver comprising:

a data input node;

an output transistor coupled between a data output node and ground, the output transistor having a gate, a source and a corresponding gate-source voltage therebetween;

a first transistor, coupled to the gate of the output transistor and responsive to signals applied to the input node, for conducting a discharge current from the gate of the output transistor for discharging the gate of the output transistor to reduce its gate-source voltage; and a clamping circuit for clamping the gate-source voltage of the output transistor to a first voltage level above around to prevent the discharge current from reducing the gate-source voltage of the output transistor to ground;

wherein the clamping circuit includes, a first p-n junction coupled to conduct at least a first portion of the discharge current, wherein the first voltage level is approximately equal to a voltage across the p-n junction.

3. A driver according to claim 2, wherein the first p-n junction is formed from a PMOS transistor, and wherein the first voltage level is approximately equal to a source-substrate voltage of the PMOS transistor.

4. A driver according to claim 2, wherein the clamping circuit further comprises:

a second p-n junction coupled in parallel with the first p-n junction for conducting at least a second portion of the discharge current; and a first resistor coupled in parallel with the first p-n junction.

5. A driver for providing binary signals from a data system to a transmission line, the driver comprising:

a data input node;

an output transistor coupled between a data output node and ground, the output transistor having a gate, a source and a corresponding gate-source voltage therebetween;

a first transistor, coupled to the gate of the output transistor and responsive to signals applied to the input node, for conducting a discharge current from the gate of the output transistor for discharging the gate of the output transistor to reduce its gate-source voltage;

a clamping circuit for clamping the gate-source voltage of the output transistor to a first voltage level above ground to prevent the discharge current from reducing the gate-source voltage of the output transistor to ground;

second and third transistors coupled together to form a current mirror, the second transistor being coupled in series with the first transistor so that the second transistor conducts the discharge current;

a fourth transistor coupled in series with the third transistor; and a positive temperature coefficient current source coupled to the fourth transistor for adjusting a gate voltage of the fourth transistor in order to compensate the discharge current, by way of the current mirror, for variations in temperature.

6. A driver according to claim 5, wherein the positive temperature coefficient current source comprises:

a fifth transistor for conducting an output current having a positive temperature coefficient, the fifth transistor having a gate which is coupled to the gate of the fourth transistor; and programmable edge rate control circuitry which can be programmed to generate alternative values of the output current so that corresponding alternative values of gate voltage are applied to the fourth transistor in order to generate corresponding alternative values of the discharge current.

7. A driver for providing binary signals from a data system to a transmission line, the driver comprising:

a data input node;

an output transistor coupled between a data output node and ground, the output transistor having a gate, a source and a corresponding gate-source voltage therebetween;

a first transistor, coupled to the gate of the output transistor and responsive to signals applied to the input node, for conducting a discharge current from the gate of the output transistor for discharging the gate of the output transistor to reduce its gate-source voltage;

a clamping circuit for clamping the gate-source voltage of the output transistor to a first voltage level above around to prevent the discharge current from reducing the gate-source voltage of the output transistor to ground; and a bypass circuit, coupled to the clamping circuit, for bypassing the clamping circuit so that the discharge current can reduce the gate-source voltage of the output transistor down to a second voltage level that is less than the first voltage level.

8. A driver according to claim 7, wherein the bypass circuit comprises:

an enable input node; and a second transistor, responsive to signals applied to the enable input node, coupled so that its current conducting channel provides a less resistive path to ground for the discharge current than the clamping circuit.

9. A driver according to claim 8, wherein the bypass circuit further comprises:

a third transistor coupled in series with the second transistor; and a positive temperature coefficient current source coupled to the third transistor for adjusting a gate voltage of the third transistor in order to compensate the discharge current for variations in temperature.

10. A driver for providing binary signals from a data system to a transmission line, the driver comprising:

a data input node;

an output transistor coupled between a data output node and ground, the output transistor having a gate, a source and a corresponding gate-source voltage therebetween;

a first transistor, coupled to the gate of the output transistor and responsive to signals applied to the input node, for conducting an initial charging current from a supply voltage node to the gate of the output transistor for charging the gate of the output transistor to increase its gate-source voltage;

a second transistor coupled in series with the first transistor; and a supply voltage dependent current source coupled to the second transistor for adjusting a gate voltage of the second transistor in response to an increase in the supply voltage so that the initial charging current is maintained at a relatively constant level in response to increases in the supply voltage.

11. A driver according to claim 10, wherein the supply voltage dependent current source comprises:

a third transistor for conducting an output current which decreases in response to increases in the supply voltage, the third transistor having a gate which is coupled to the gate of the second transistor; and positive temperature coefficient current source circuitry coupled to the third transistor for compensating the output current and the initial charging current for variations in temperature.

12. A driver according to claim 11, wherein the positive temperature coefficient current source circuitry comprises:

programmable edge rate control circuitry which can be programmed to generate alternative values of the output current so that corresponding alternative values of gate voltage are applied to the second transistor in order to generate corresponding alternative values of the initial charging current.

13. A driver for providing binary signals from a data system to a transmission line, the driver comprising:

a data input node;

an output transistor coupled between a data output node and ground, the output transistor having a gate, a source and a corresponding gate-source voltage therebetween;

a first transistor, coupled to the gate of the output transistor and responsive to signals applied to the input node, for conducting a charge holding current to the gate of the output transistor for maintaining a charge on the gate of the output transistor to maintain its gate-source voltage at a relatively constant level;

second and third transistors coupled in series with the first transistor to conduct the charge holding current; and a positive temperature coefficient current source coupled to the second and third transistors for adjusting gate voltages of the second and third transistors in order to compensate the charge holding current for variations in temperature.

14. A driver according to claim 13, wherein the positive temperature coefficient current source comprises:

fourth and fifth series coupled transistors for conducting an output current having a positive temperature coefficient, the fourth and fifth transistors each having a gate with the gate of the fourth transistor being coupled to the gate of the second transistor and the gate of the fifth transistor being coupled to the gate of the third transistor; and programmable edge rate control circuitry which can be programmed to generate alternative values of the output current so that corresponding alternative values of gate voltages are applied to the fourth and fifth transistors in order to generate corresponding alternative values of the charge holding current.

15. A driver for providing binary signals from a data system to a transmission line, the driver comprising:

a data input node;

an output transistor coupled between a data output node and ground, the output transistor having a gate, a source and a corresponding gate-source voltage therebetween;

a voltage sensing amplifier coupled to the gate of the output transistor for conducting a charging current to the gate of the output transistor to increase its gate-source voltage;

a first transistor, responsive to signals applied to the input node, for conducting a first current to the voltage sensing amplifier;

second and third transistors coupled in series with the first transistor and coupled to the voltage sensing amplifier to conduct the first current; and a positive temperature coefficient current source coupled to the second and third transistors for adjusting gate voltages of the second and third transistors in order to compensate the first current for variations in temperature.

16. A driver according to claim 15, wherein the positive temperature coefficient current source comprises:

fourth and fifth series coupled transistors for conducting an output current having a positive temperature coefficient, the fourth and fifth transistors each having a gate with the gate of the fourth transistor being coupled to the gate of the second transistor and the gate of the fifth transistor being coupled to the gate of the third transistor; and programmable edge rate control circuitry which can be programmed to generate alternative values of the output current so that corresponding alternative values of gate voltages are applied to the fourth and fifth transistors in order to generate corresponding alternative values of the first current.

17. A method of reducing a turn-on delay of an output transistor of a transmission line driver, comprising the steps of:

discharging a gate of the output transistor with a discharge current in order to reduce a gate-source voltage of the output transistor;

clamping the gate-source voltage of the output transistor to a first voltage level above ground and below a threshold voltage of the output transistor in order to prevent the gate-source voltage of the output transistor from being reduced to ground; and charging the gate of the output transistor in order to increase its gate-source voltage from the first voltage level to a voltage level above the threshold voltage.

18. A method according to claim 17, wherein the clamping step comprises the step of:

conducting at least a first portion of the discharge current through a first p-n junction, wherein the first voltage level is approximately equal to a voltage across the p-n junction.

19. A method according to claim 18, wherein the clamping step further comprises the step of:

conducting the first portion of the discharge current through a PMOS transistor, wherein the first voltage level is approximately equal to a source-substrate voltage of the PMOS transistor.

20. A method according to claim 18, wherein the clamping step comprises the step of:

conducting at least a second portion of the discharge current through a second p-n junction coupled in parallel with the first p-n junction; and conducting at least a third portion of the discharge current through a first resistor coupled in parallel with the first p-n junction.

21. A method according to claim 17, further comprising the step of:

compensating the discharge current for variations in temperature and supply voltage.

22. A method according to claim 17, further comprising the step of:

providing a programmable edge rate control circuit which can be programmed to generate alternative values of the discharge current.

23. A method according to claim 17, further comprising the step of:

bypassing the clamping step so that the discharge current can reduce the gate-source voltage of the output transistor down to a second voltage level that is less than the first voltage level in order to reduce leakage current in the output transistor.

24. A method according to claim 23, wherein the clamping step is performed with a clamping circuit and the bypassing step comprises the step of:

providing a current conducting path to ground for the discharge current that is less resistive than a current conducting path provided by the clamping circuit.

* * * * *

UNITED STATES PATENT AND TRADEMARK OFFICE
CERTIFICATE OF CORRECTION

PATENT NO.: 5,818,260
DATED: October 6, 1998
INVENTOR(S): JAMES R. KUO

It is certified that two errors appear in the above-identified patent and that said Letters Patent is hereby corrected as shown below:

In Col. 17, line 47, delete "around" and replace with --ground--.

In Col. 18, line 53, delete "around" and replace with --ground--.

Signed and Sealed this

Twenty-ninth Day of December, 1998

Attest:

BRUCE LEHMAN

Attesting Officer

Commissioner of Patents and Trademarks